United States Patent [19]

Kiri

[11] Patent Number: 4,914,302
[45] Date of Patent: Apr. 3, 1990

[54] RADIATION IMAGE DETECTING APPARATUS

[75] Inventor: Motosada Kiri, Kyoto, Japan

[73] Assignee: Shimadzu Corporation, Kyoto, Japan

[21] Appl. No.: 194,291

[22] Filed: May 16, 1988

[30] Foreign Application Priority Data

May 15, 1987 [JP] Japan .................................. 62-119766

[51] Int. Cl.⁴ ............................ G01T 1/22; G01J 1/00
[52] U.S. Cl. ................................ 250/370.15; 250/352
[58] Field of Search ................ 250/370.15, 338.4, 346, 250/348, 352

[56] References Cited

U.S. PATENT DOCUMENTS 4,546,614 10/1985 Kline et al. ...................... 250/370.15
4,682,032 7/1987 Barrett ............................ 250/370.15
4,740,700 4/1988 Shaham et al. ................... 250/338.3

Primary Examiner—Janice A. Howell
Assistant Examiner—J. Eisenberg
Attorney, Agent, or Firm—Koda & Androlia

[57] ABSTRACT

In a radiation image detecting apparatus having its image receiving means constituted of a two-dimensional array of composite radiation detecting units each of which includes a radiation sensor and a signal processing circuit, the composite radiation detecting units are provided with circuit cooling means for suppressing heat generation at the above signal processing circuits. The circuit cooling means consists only of piping in thermal contact with the composite radiation detecting units, or consists both of the the piping or the duct-and-coolant intakes combination and of porous-walled gas piping stretched through the clearances left between two adjacent composite radiation detecting units constituting the two-dimensional or the one-dimensional composite radiation detecting unit array. The piping and the duct-and-coolant intakes combination are supplied with a liquid coolant, while the porous-walled gas piping supplied with a gaseous coolant. The gaseous coolant turbulently leaks out through the porous wall of the gas piping and drives away heat stagnation in the above clearances.

1 Claim, 4 Drawing Sheets

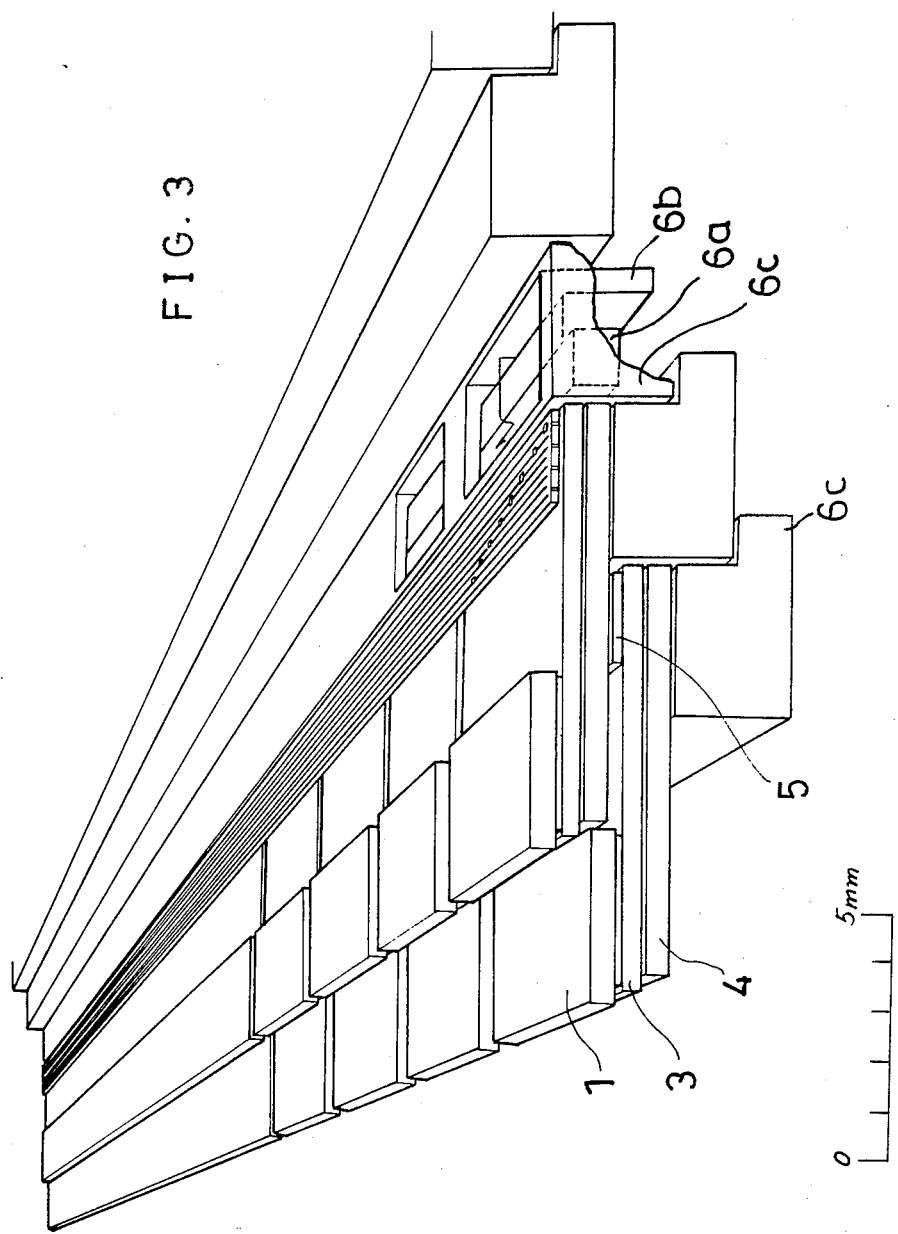

RADIATION IMAGE DETECTING APPARATUS

BACKGROUND OF THE INVENTION

The present invention relates to a radiation image detecting apparatus, and more particularly to an apparatus for detecting a radiation image such as an X-ray image with the image divided into pixels.

In an ordinary system of detecting an radiation image with the image once divided into pixels, a two-dimensional array of unit radiation sensors corresponding to the pixels is positioned so that a radiation image to be detected may be projected properly thereon, or such a two-dimensional sensor array is replaced with a one-dimensional sensor array devised so as to mechanically sweep the (imaginary image-receiving) plane with which the above two-dimensional sensor array should be positioned coincidently. The signals outputted from the unit radiation sensors, which signals are pixel signals, are purposefully processed with electronic circuits so as to be displayed as a visualized radiation image on a CRT screen. In such a radiation image detecting system, the resolving power of a detected radiation image depends on the size of the unit radiation sensors used in the above two- or one-dimensional sensor array. A typical size of the unit sensors is selected to be about 0.3 mm square for a typical dimension 30 cm$^2$ of the radiation image to be detected. This causes the number of sensors to lie in the order of $10^3$ (for the one-dimensional sensor array) to $10^6$ (for the two-dimensional sensor array). Such a numerous number of sensors are further followed by the same number of lead circuits to lead the output signals to the separately provided signal processing electronic circuits. In the above constitution of the system, therefore, the disposition of a large number of lead wires, though bundled in the form of a single cable, provides some severe problems to be solved, especially in the case where the radiation detection is carried out with a one-dimensional sensor array which is made to sweep the radiation image receiving plane. In addition, long wiring of the lead wires is liable to pick up external noise. A conventional way of overcoming the above disadvantages is to to combine each of the unit radiation sensors with a respective signal processing electronic circuit so as to constitute a composite radiation detector unit as shown in FIG. 5. Many such composite radiation detector units are closely arrayed one-dimensionally or two-dimensionally with only the radiation sensors exposed. Referring to FIG. 5, a radiation sensor 1 is accompanied by a semiconductor chip 3 provided, on its upper surface, with an integrated circuit for processing the signal outputted from the radiation sensor 1. The output from the the integrated circuit is led out through a lead circuit printed on a printing base 5 extending over other composite radiation detector units arrayed in the direction vertical to the sheet on which FIG. 5 is drawn. Although such a radiation image receiving means makes the system free from a numerous number of lead wires connecting between radiation sensors and electronic circuits, the close array of composite radiation detector units is inevitably accompanied by a large heat generation. The heat generation, which deteriorates the performance of the electronic circuits contained and often damages the circuits, is conventionally suppressed by means of forced air-cooling or by operating the system intermittently. However, the method of air-cooling is not only ineffective but also liable to give vibrations to the array of composite radiation detector units, while the intermittent operation of the system causes a series of successive radiation image detecting work to be kept at low efficiency. In addition, since the intermittent operation is still accompanied by a low level heat generation, the electronic circuits are necessarily provided with any means for compensating possible performance deterioration of the circuits.

OBJECTS AND SUMMARY OF THE INVENTION

The present invention aims at eliminating the disadvatages and difficulties mentioned above in conjunction with conventional radiation image detecting apparatuses of a type in which the radiation image is detected with the image divided into pixels. It is a further object to provide an improved radiation image detecting apparatus made substantially free from the adverse effects due to heat generation without adding any heat effect compensation circuit to the signal processing electronic circuits.

Another object of the present invention is to constitute such an improved apparatus in as simple a construction as possible.

Also in the radiation image detecting apparatus according to the present invention, the radiation image receiving part consists of a one-dimensional or two-dimensional array of composite radiation detector units similar to that illustrated in FIG. 5. In the present invention, however, each row in the the array of the composite radiation detector units is provided with a cooling pipe with thermally conductive plates interposed between the same and the circuit-carrying semiconductor plate in each composite radiation detector unit. In one embodiment of the invention the circuuit-carrying semiconductor plates are further provided with a gas-cooling means consisting of a cooling gas pipe whose wall is made porous. A cooling gas turbulently leaking out through the porous wall of the pipe gives additional effect of cooling.

BRIEF DESCRIPTION OF THE DRAWINGS

In the following the present invention is described in further detail on reference to the accompanying drawings, in which:

FIG. 3 shows a side view of a second embodiment of the present invention;

DETAILED DESCRIPTION OF THE INVENTION

Figure 1:
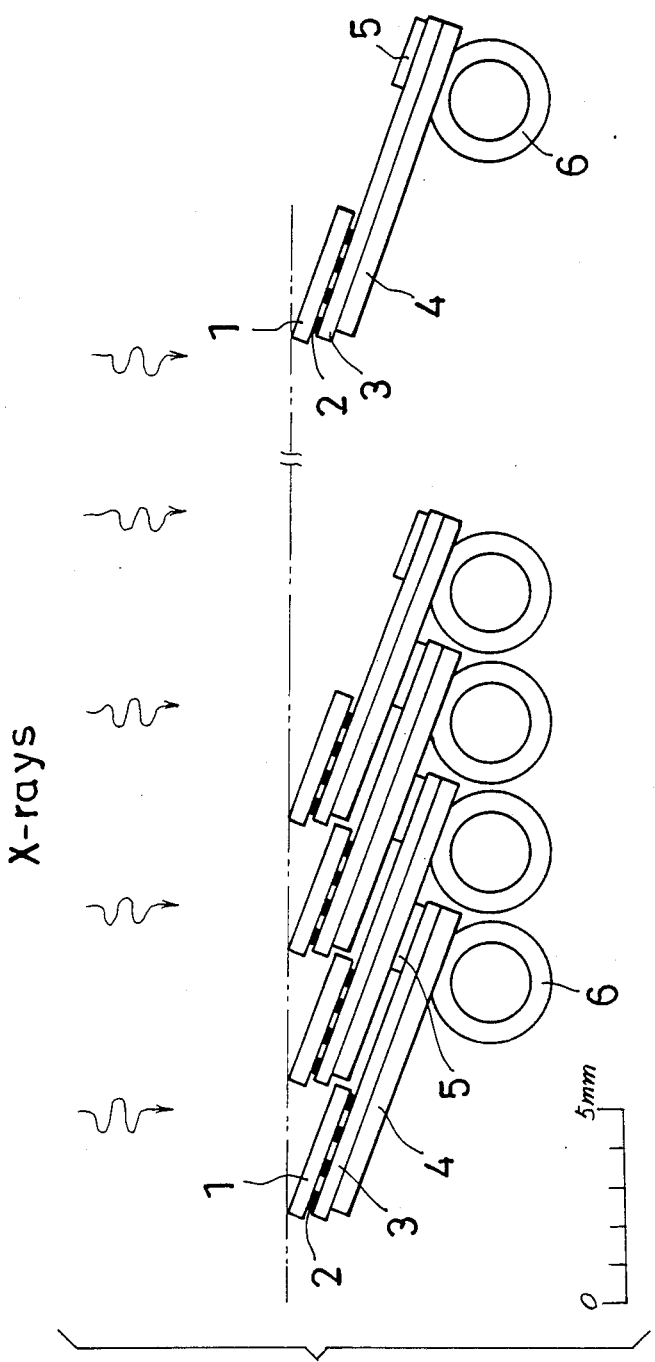
FIG. 1 shows a side view of a first embodiment of the present invention.
Figure 2:
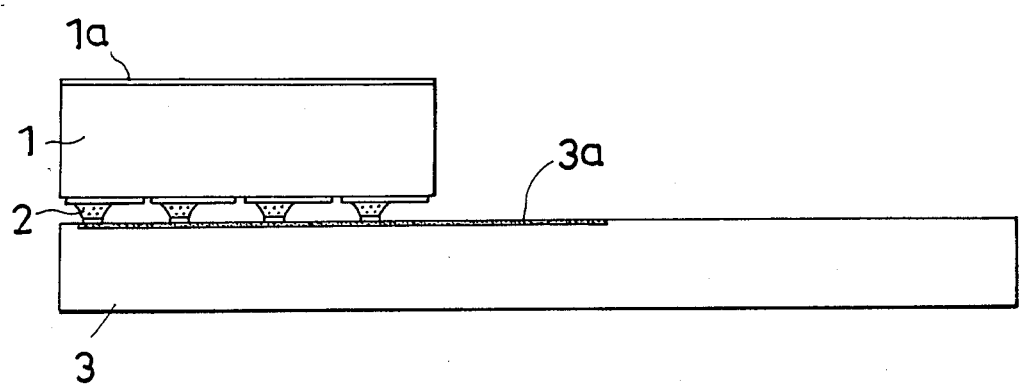
FIG. 2 shows a partial side view illustrating the detail of a composite radiation detector used in the present invention.
Figure 5:
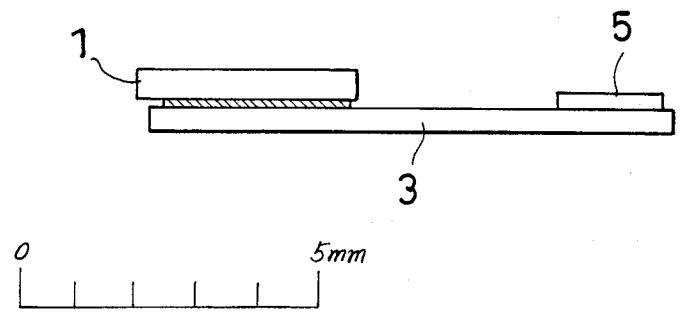
FIG. 5 shows a side view of a composite radiation detector unit used in a conventional radiation detecting apparatus.

A first embodiment of the present invention is described on reference mainly to FIGS. 1 and 2. Referring to FIG. 1, which shows a side view of the embodiment consisting of composite radiation detector units arrayed in the form a radiation sensor matrix, a plurality of composite radiation detector units are arranged so as to form rows in the direction perpendicular to the sheet carrying the drawing, and such rows are further arranged in the direction perpendicular to themselves with one placed partially over another so as to make only their radiation sensor parts 1 exposed. In such an entire construction of the embodiment, each of the composite radiation detector units has its main part, similar to the case of the conventional composite radiation detector units as previously mentioned in reference FIG. 5, made up of a radiation sensor 1 and a semiconductor plate 3 on which a signal processing electronic circuit, is formed and is provided with a common narrow and long circuit board 5 extending over all of the composite radiation detector units belonging to the same row. On the circuit board 5 there are, of course, printed the output leads of the signal processing circuits formed on the semiconductor plates 3. In the present invention, however, a common cooling pipe 6 is fixed to all the composite radiation detector units in the same row, with a thermally conductive plate 4 interposed between the pipe 6 and the semiconductor plate 3 in each of the the composite radiation detector units. Thus, a coolant such as water poured in tbe cooling pipe 6 effectively cools all of the composite radiation detector units, especially their respective semiconductor plates 3 carrying signal processing circuits.

In FIG. 1 a reference numeral 2 indicates the circuit connections between the radiation sensor 1 and the signal processing circuit formed on the semiconductor plate 3 in each of the composite radiation detectors. The connections 2 are preferably constituted in the form of bumps made of a soldering material, as is shown in detail in FIG. 2, in which reference signs 1a and 3a respectively indicate the radiation receiving surface of the radiation sensor 1 and the signal processing circuit formed on the semiconductor plate 3.

A second embodiment of the present invention is described in reference to FIG. 3, which shows a partially cut out perspective view of the second embodiment. In FIG. 2 all the constituents corresponding to those shown in FIG. 1 are indicated with the same reference numerals as those used in FIG. 1. In this second embodiment, only the common cooling pipe 6 in the first embodiment (FIG. 1) is repalced with a combination of a common duct 6 and a plurality of independent coolant intakes 6b provided in correspondence to individual composite radiation detector units. The coolant intakes 6 have their opening kept downward and supplied with any suitable coolant such as water from below through (not shown) suitable coolant supply means. According to such a cooling system, the thermally conductive plates 4 in all the composite radiation detector units can be cooled equally by the respective coolant streams at the same temperature. If in the first embodiment a large heat generation causes considerable temperature difference between both ends of the cooling pipe 6, this second embodiment is preferably substituted for the first embodiment.

Figure 4:
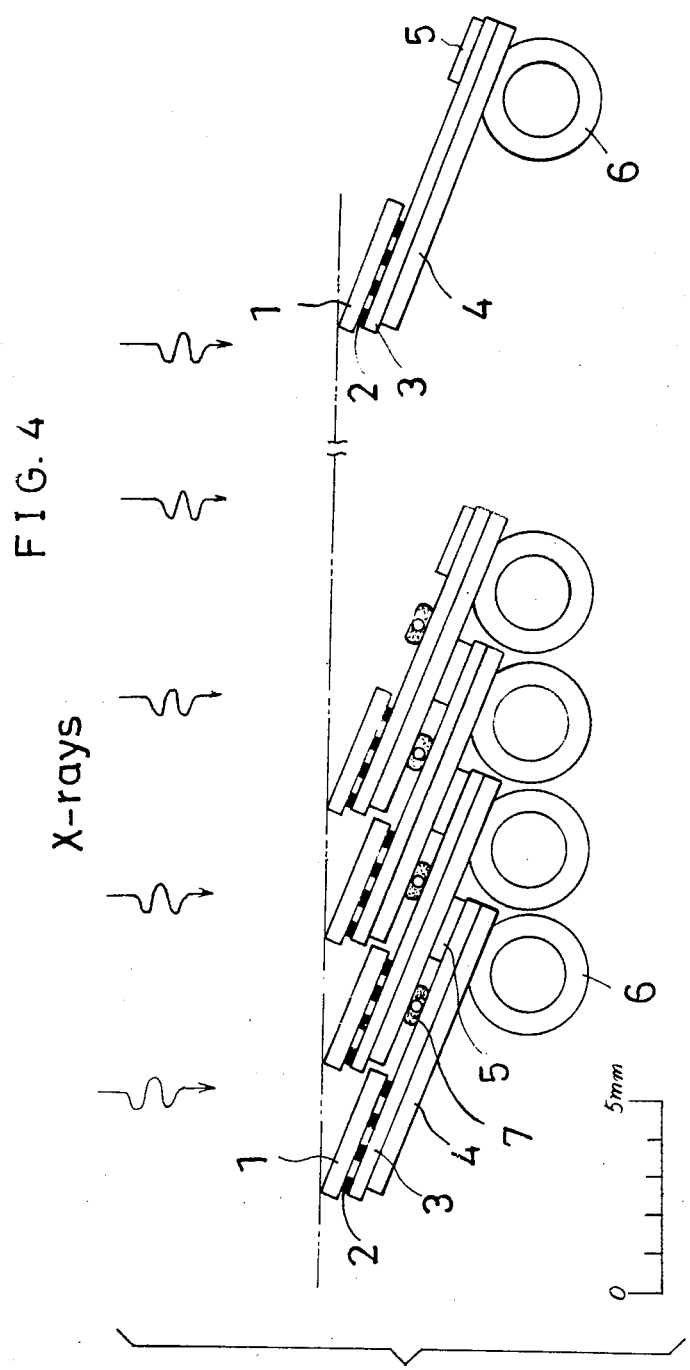
FIG. 4 shows a side view of a third embodiment of the present invention.

The present invention is embodied further in the form of a third embodiment whose side view is shown in FIG. 4. In this embodiment there are provided gas-cooling pipes 7 in all of the clearances left between adjacent overlapping rows of composite radiation detector units. The gas-cooling pipes 7 have their pipe-walls made of a porous material. Thus, a cooling gas such as air poured into the pipes 7 is turbulently leaked out through the porous wall and drives away possible heat stagnation between the adjacent composite radiation detector units, increasing the entire cooling efficiency. Further, the turbulent gas streams between the above adjacent composite radiation detector units have an effect of promoting the heat transfer between the hotter side (the semiconductor plate 3 of the upper composite radiation detector unit) and the cooler side (the thermally conductive plate 4 of the lower composite radiation detector unit).

It is needless to say that the previously described second embodiment can also be modified by applying thereto the above gas-cooling pipes 7.

Although all of the above embodiments are fabricated as two-dimensional apparatuses of radiation image detection, it also is needless to mention that the present invention can be embodied in the form of a one-dimensional apparatus. In all of the above descriptions, the additional equipments such a memory, a CRT and others necessary to complete a visible image are omitted because they only belong to well-known conventional art.

I claim:

1. A radiation image detecting apparatus having its radiation image receiving portion composed of arrayed unit radiation sensors for the purpose of detecting a radiation image with the same divided into pixels, said radiation image detecting apparatus comprising:

a plurality of radiation detector units each of which consists of said unit radiation sensor and a semiconductor chip carrying thereon an integrated circuit for processing output signals from said unit radiation sensor, both said unit radiation sensor and said semiconductor chip assembled in one body by mounting said unit radiation sensor on one end of said semiconductor chip, said radiation detector units being arrayed two-dimensionally with their respective units radiation sensors exposed;

a plurality of first cooling pipes each of which prolonged along each row of said radiation detector units arrayed two-dimensionally and has thermal contact with the semiconductor chips of the radiation detector units belonging to the same row, said first cooling pipes allowing a liquid coolant to flow therethrough; and a plurality of second cooling pipes, each of which is prolonged along each row of said radiation detector units arrayed two-dimensionally and being inserted in the clearances made between the upper and the lower surfaces of the radiation detector units belonging to two adjacent rows of said radiation detector units arrayed two-dimensionally, said second cooling pipes, which are to allow a gaseous coolant to flow therethrough, being made of a porous material for the purpose of letting said gaseous coolant leak in the form of turbulent gas streams while said gaseous coolant flows through said second cooling pipe.

* * * * *